United States Patent
Zhou et al.

(10) Patent No.: US 9,851,780 B2
(45) Date of Patent: Dec. 26, 2017

(54) SEMICONDUCTOR DEVICE AND OPERATING METHOD THEREOF

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW); Chen-Bin Lin, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 246 days.

(21) Appl. No.: 14/829,644

(22) Filed: Aug. 19, 2015

(65) Prior Publication Data

US 2017/0017416 A1 Jan. 19, 2017

(30) Foreign Application Priority Data

Jul. 15, 2015 (TW) .............................. 104122845 A

(51) Int. Cl.
| | |
|---|---|
| *G06F 1/32* | (2006.01) |
| *G06F 3/06* | (2006.01) |
| *H01L 27/10* | (2006.01) |
| *H01L 27/06* | (2006.01) |
| *H01L 27/07* | (2006.01) |
| *H01L 27/108* | (2006.01) |
| *G11C 16/00* | (2006.01) |
| *G11C 7/10* | (2006.01) |
| *G11C 5/14* | (2006.01) |

(52) U.S. Cl.
CPC ............ *G06F 1/3293* (2013.01); *G06F 1/324* (2013.01); *G06F 1/3275* (2013.01); *G06F 1/3287* (2013.01); *G11C 7/1006* (2013.01); *G11C 16/00* (2013.01); *H01L 27/06* (2013.01); *H01L 27/07* (2013.01); *H01L 27/108* (2013.01); *G11C 5/141* (2013.01); *G11C 2211/4016* (2013.01)

(58) Field of Classification Search
CPC ...... G06F 1/3293; G06F 1/324; G06F 1/3275; G06F 1/3287; G06F 3/065; H01L 27/06; H01L 27/07; H01L 27/108
See application file for complete search history.

(56) References Cited

U.S. PATENT DOCUMENTS

| | | | | |
|---|---|---|---|---|
| 8,365,002 B2 * | 1/2013 | Narushima | ............. | G06F 1/266 713/300 |
| 8,421,069 B2 * | 4/2013 | Yamazaki | ............... | H01L 21/84 257/43 |
| 8,527,709 B2 * | 9/2013 | Jahagirdar | ............ | G06F 1/3203 711/130 |

(Continued)

*Primary Examiner* — Stefan Stoynov
(74) *Attorney, Agent, or Firm* — Winston Hsu

(57) ABSTRACT

A semiconductor device includes a main processor, a normally-off processor, and at least one oxide semiconductor random access memory (RAM). The normally-off processor includes at least one oxide semiconductor transistor. The main processor is connected to the normally-off processor, and a clock rate of the main processor is higher than a clock rate of the normally-off processor. The oxide semiconductor RAM is connected to the normally-off processor. An operating method of the semiconductor includes backing up data from the main processor to the normally-off processor and/or the oxide semiconductor RAM.

7 Claims, 4 Drawing Sheets

(56) References Cited

U.S. PATENT DOCUMENTS

2005/0114722 A1* 5/2005 Tanaka ................ G06F 1/3203
713/320
2011/0089414 A1* 4/2011 Yamazaki ........... H01L 27/1225
257/43
2014/0004656 A1 1/2014 Sasagawa

* cited by examiner

SEMICONDUCTOR DEVICE AND OPERATING METHOD THEREOF

BACKGROUND OF THE INVENTION

1. Field of the Invention

The present invention relates to a semiconductor device and an operating method thereof, and more particularly, to a semiconductor device including a normally-off processor made of oxide semiconductors and an oxide semiconductor random access memory and an operating method of this semiconductor device.

2. Description of the Prior Art

There are many different kinds of electronic products in the market, and no matter how inventive the functions of these products are or how the functions vary, power consumption is always an important subject to be improved in all kinds of the electronic products. For portable electronic products such as smart phones, smart watches, and electronic bracelets, compact and lightweight designs and battery life are important specifications of the products. For enhancing the battery life without affecting the compact and lightweight designs, improving the power consumption of the electronic device is the most basic and direct approach.

SUMMARY OF THE INVENTION

It is one of the objectives of the present invention to provide a semiconductor device and an operating method thereof. Oxide semiconductors with low leakage current are used to form a normally-off processor and a random access memory so as to achieve the purpose of reducing the power consumption.

A semiconductor device is provided in an embodiment of the present invention. The semiconductor device includes a main processor, a normally-off processor, and at least one oxide semiconductor random access memory (RAM). The normally-off processor includes at least one oxide semiconductor transistor. The main processor is connected to the normally-off processor, and a clock rate of the main processor is higher than a clock rate of the normally-off processor. The oxide semiconductor RAM is connected to the normally-off processor.

An operating method of a semiconductor device is provided in an embodiment of the present invention. The semiconductor device includes a main processor, a normally-off processor, and at least one oxide semiconductor random access memory (RAM). The normally-off processor includes at least one oxide semiconductor transistor. The main processor is connected to the normally-off processor, and a clock rate of the main processor is higher than a clock rate of the normally-off processor. The oxide semiconductor RAM is connected to the normally-off processor. The operating method of the semiconductor device includes backing up data from the main processor to the normally-off processor and/or the oxide semiconductor RAM.

In the semiconductor device and the operating method thereof in the present invention, the normally-off processor with the relatively lower clock rate and the random access memory are composed of oxide semiconductors with low leakage current so as to achieve the purpose of reducing the power consumption accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
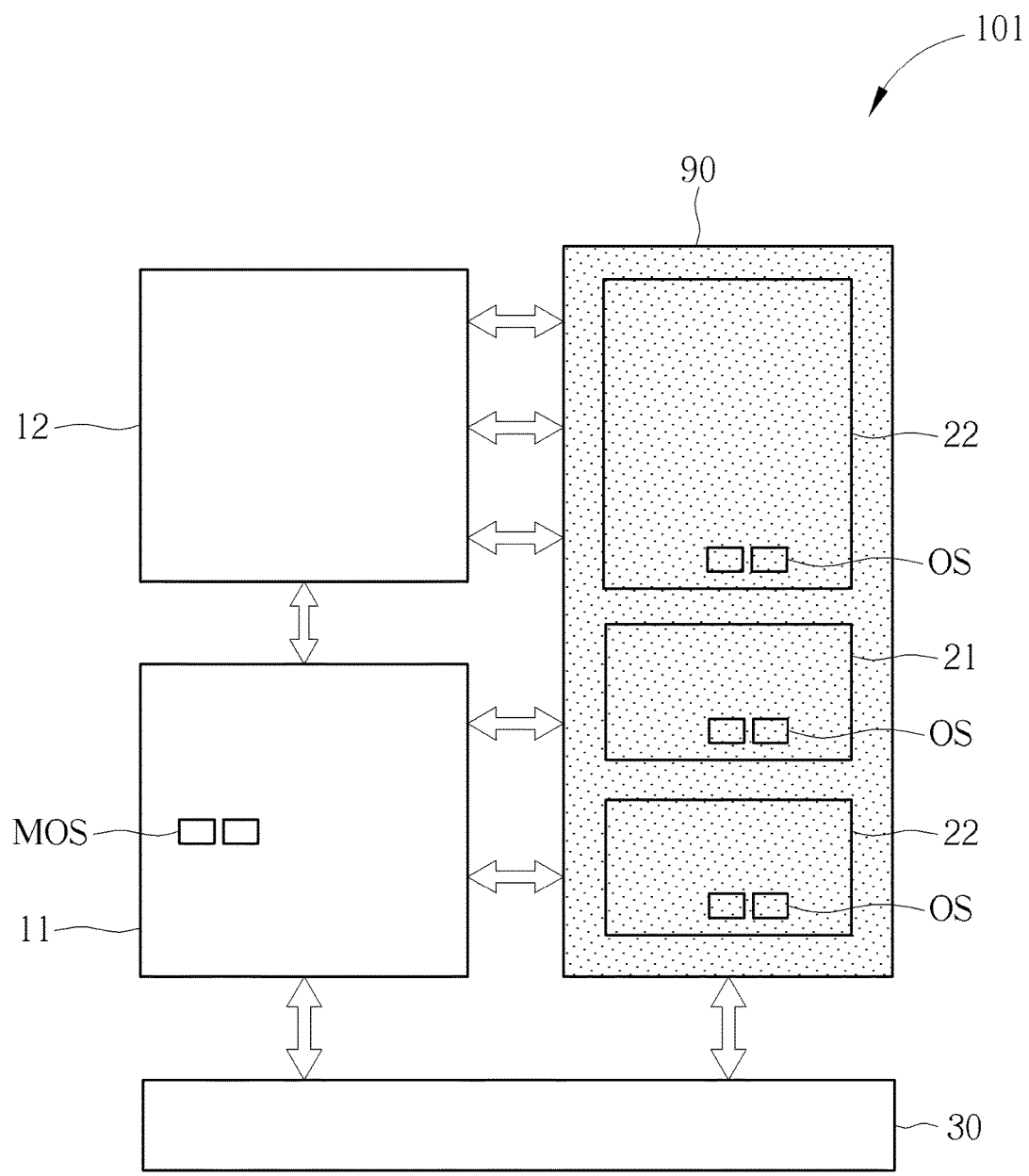
FIG. 1 is a schematic drawing illustrating a semiconductor device according to a first embodiment of the present invention.

Please refer to FIG. 1. FIG. 1 is a schematic drawing illustrating a semiconductor device according to a first embodiment of the present invention. As shown in FIG. 1, a semiconductor device 101 is provided in this embodiment. The semiconductor device 101 includes a main processor 11, a normally-off processor 21, and at least one oxide semiconductor random access memory (RAM) 22. The normally-off processor 21 includes at least one oxide semiconductor transistor OS. In this embodiment, the oxide semiconductor transistor OS may include an indium gallium zinc oxide (IGZO) transistor or a transistor composed of other suitable oxide semiconductor materials. The oxide semiconductor RAM 22 may include an IGZO RAM or random access memories composed of other suitable oxide semiconductor materials. For example, when the oxide semiconductor RAM 22 is a 6T static random access memory (SRAM), at least one the six transistors is the oxide semiconductor transistor OS, but not limited thereto. The oxide semiconductor materials mentioned above may include a group II-VI compound (such as zinc oxide, ZnO), a group II-VI compound doped with alkali earth metal (such as magnesium zinc oxide, ZnMgO), a group II-VI compound doped with group IIIA element (such as indium gallium zinc oxide, IGZO), a group II-VI compound doped with group VA element (such as stannum stibium oxide, $SnSbO_2$), a group II-VI compound doped with group VIA element (such as zinc selenium oxide, ZnSeO), a group II-VI compound doped with transition metal (such as zinc zirconium oxide, ZnZrO), or other semiconductor oxide made by mixing the above-mentioned elements, but not limited thereto. Additionally, in this embodiment, the main processor 11 is a silicon semiconductor processor including a silicon metal oxide semiconductor unit MOS preferably, and the normally-off processor 21 may be composed of the oxide semiconductor transistor OS and the silicon metal oxide semiconductor unit or may be simply consisted of the oxide semiconductor transistors OS preferably. The main processor 11 is connected to the normally-off processor 21. The oxide semiconductor RAM is connected to the normally-off processor. According to the related technologies nowadays, the efficacy of the oxide semiconductor transistor OS is still a little bit lower than that of the silicon metal oxide semiconductor unit MOS, and a clock rate of the main processor 11 is higher than a clock rate of the normally-off processor 21 accordingly. The main processor 11 may have better efficacy and clock rate for the operation demands of the semiconductor device 101 under normal operations. However, the requirement of the clock rate level in the normally-off processor 21 is relatively lower, and at least a part of the normally-off processor 21 may be composed of the oxide semiconductor transistors OS accordingly. In addition, leakage current of the oxide semiconductor transistor OS is lower than leakage current of the silicon metal oxide semiconductor unit MOS, and the oxide semiconductor transistor OS may be used to improve the power consumption conditions of the normally-off processor 21 and the oxide semiconductor RAM 22.

In this embodiment, the normally-off processor 21 and a plurality of the oxide semiconductor RAMs may be integrated in one die 90 for design considerations, but not limited thereto. The main processor 11 is connected to the normally-off processor 21, and the oxide semiconductor RAM 22 is connected to the normally-off processor 21 and the main processor 11. Additionally, the semiconductor device 101 in this embodiment may further include a high speed RAM 12 and a peripheral unit 30. The high speed RAM 12 is connected to the main processor 11 and the die 90 of the normally-off processor 21 and the oxide semiconductor RAM 22. In this embodiment, the high speed RAM 12 may include a low power double data rate (LPDDR) SRAM, but not limited thereto. The peripheral unit 30 is connected to the main processor 11 and the normally-off processor 21. The peripheral unit 30 in this embodiment may include a global positioning system (GPS) unit, a wireless networking unit, a sensor unit, or other suitable peripheral units.

An operating method of the semiconductor device 101 in this embodiment may include providing the semiconductor device 101 described above and backing up data from the main processor 11 to the normally-off processor 21 and/or the oxide semiconductor RAM 22. More specifically, in the operation method of the semiconductor device 101 of this embodiment, the normally-off processor 21 and/or the oxide semiconductor RAM 22 may be used to backup data such as register data and codes from the main processor 11 and/or the high speed RAM 12 before and/or after the main processor 11 enters a sleep mode. Therefore, when the main processor 11 enters the sleep mode, the operating method in this embodiment may include collecting data from the peripheral unit 30 to the normally-off processor 21 and/or the oxide semiconductor RAM 22. The normally-off processor 21 may also be used to continuously update a running program when the main processor 11 enters the sleep mode. The time used to wake up the semiconductor device 101 in the sleep mode for entering the normal operation mode has to be as short as possible (less than 50 microseconds, for example), so as to keep the users from feeling delayed. High speed bus is required to be disposed between the high speed RAM 12 and the normally-off processor 21 and between the high speed RAM 12 and the oxide semiconductor RAM 22. The high speed bus is also required to be disposed between the main processor 11 and the normally-off processor 21 and between the main processor 11 and the oxide semiconductor RAM 22, so as to improve the issue of delay in data transferring. The high speed RAM 12, the main processor 11, and the peripheral unit 30 in this embodiment may also be integrated in another die or be disposed in different dies respectively. Accordingly, the die 90 of the normally-off processor 21 and the oxide semiconductor RAM 22 may be connected to the main processor 11 by a 2.5D IC package technique or a 3D IC package technique so as to achieve the purpose of high speed data transferring.

The semiconductor device 101 may be applied in high-end electronic products because the semiconductor device 101 still includes the high speed RAM 12 and the main processor 11 may include a cache memory such as a L1/L2 cache memory. In this situation, the clock rate of the normally-off processor 21 and/or the oxide semiconductor RAM 22 may be higher than or equal to 200 MHz preferably, but not limited thereto. For example, the semiconductor device 101 in this embodiment may be applied in e-ink display devices or e-paper display devices, and the main processor 11 and the high speed RAM 12 may be used to drive the display device for displaying images. In the e-paper display device, it is not necessary to continuously update or refresh the display image, and the main processor 11 may enter a sleep mode when there is no need to update or refresh the display image. In the sleep mode, the normally-off processor 21 may be used to assist in handling program updates and backup data from the peripheral unit 30 so as to reduce power consumption. In other words, the main processor 11 in the semiconductor device 101 of this embodiment can provide required efficacy performance for the applied product, and the normally-off processor 21 and the oxide semiconductor RAM 22 which are composed of oxide semiconductors may be applied to save power. Compared with semiconductor devices composed of oxide semiconductors completely or semiconductor devices composed of silicon semiconductors completely, the semiconductor device 101 in this embodiment may provide more balanced performances on both the efficacy and the power consumption.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
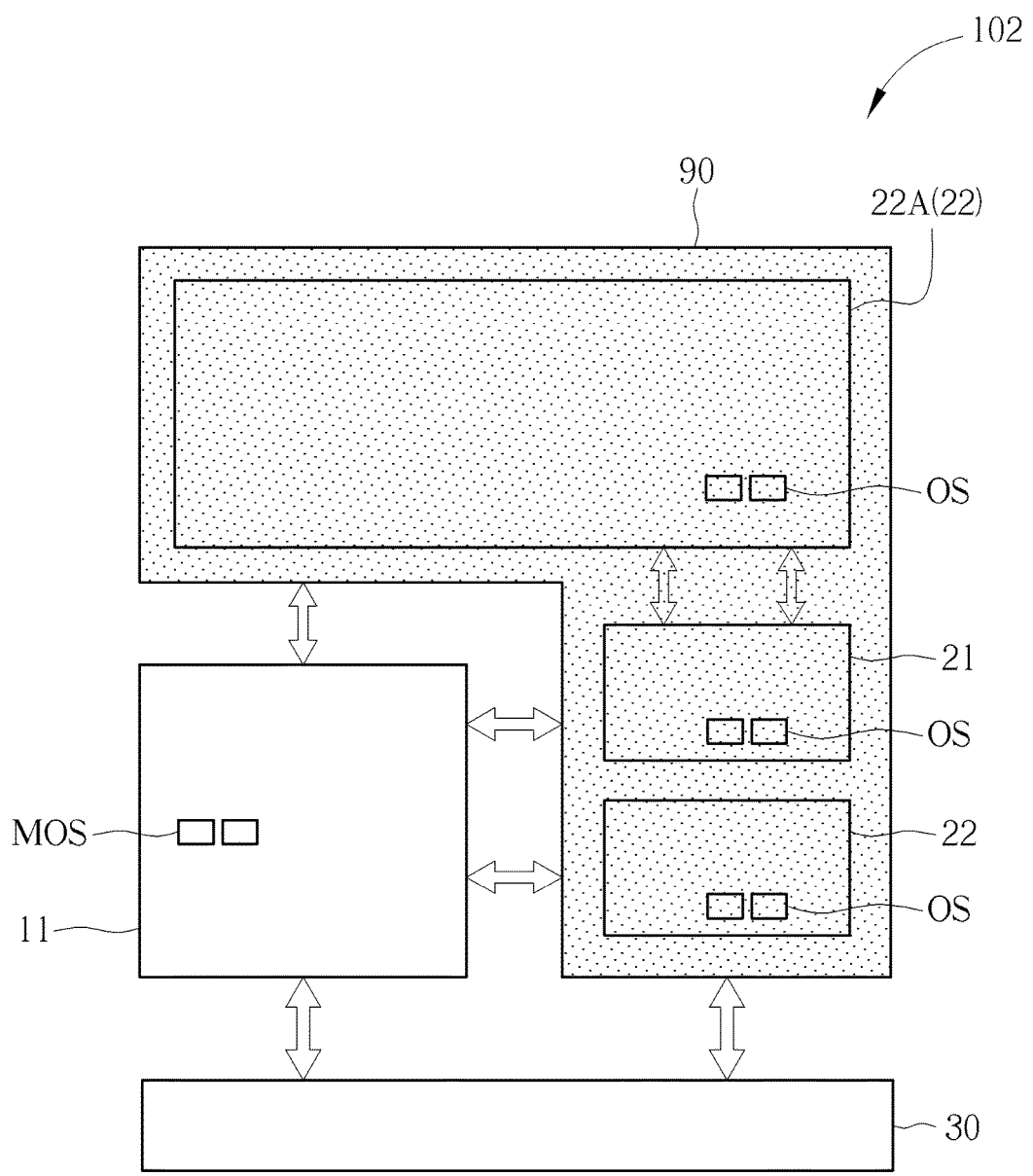
FIG. 2 is a schematic drawing illustrating a semiconductor device according to a second embodiment of the present invention.

Please refer to FIG. 2. FIG. 2 is a schematic drawing illustrating a semiconductor device 102 according to a second embodiment of the present invention. As shown in FIG. 2, the differences between the semiconductor device 102 of this embodiment and the semiconductor device of the first embodiment mentioned above is that the oxide semiconductor RAM 22 in the semiconductor device 102 of this embodiment may include a dynamic random access memory (DRAM) 22A, and the DRAM 22A may be used to replace the high speed RAM in the first embodiment mentioned above. The DRAM 22A is shared by the main processor 11 and the normally-off processor 21. For example, the transistors in the DRAM 22A may be the oxide semiconductors OS, but not limited thereto. It is worth noting that it is easier to shorten the time used to wake up the semiconductor device 102 in the sleep mode for entering the normal operation mode and avoid the delay issue because the DRAM 22A in the semiconductor device 102 is an oxide semiconductor RAM integrated with the normally-off processor 21 and other oxide semiconductor RAMs 22 in the same die 90. In addition, the efficacy of the DRAM 22A may be relatively lower (about lower than 300 MHz) because the DRAM 22A in the semiconductor device 102 is an oxide semiconductor RAM, and the semiconductor device 102 is more suitable for being applied in the middle-end electronic products preferably, but not limited thereto.

Figure 3:
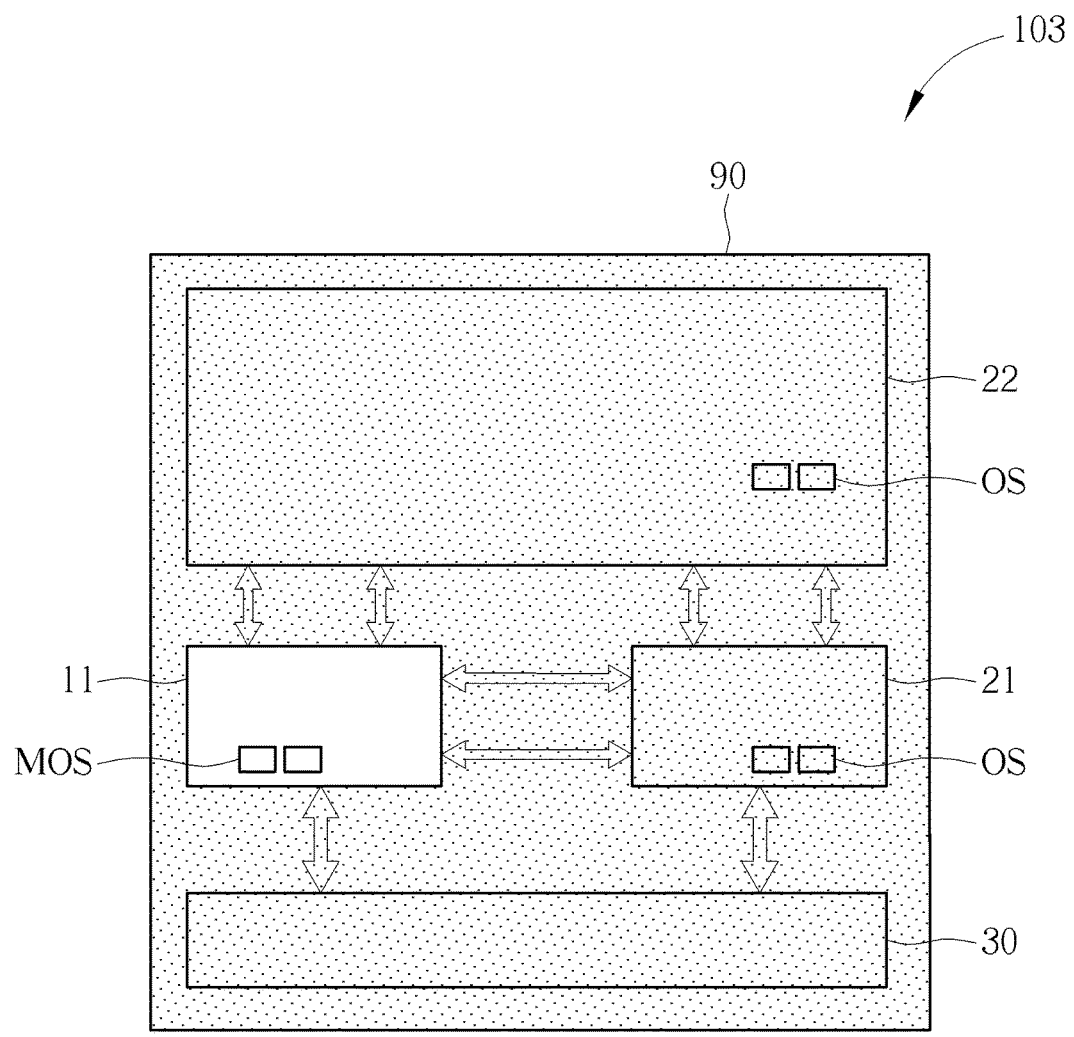
FIG. 3 is a schematic drawing illustrating a semiconductor device according to a third embodiment of the present invention.

Please refer to FIG. 3. FIG. 3 is a schematic drawing illustrating a semiconductor device 103 according to a third embodiment of the present invention. As shown in FIG. 3, the differences between the semiconductor device 103 of this embodiment and the semiconductor device of the first embodiment mentioned above is that, the main processor 11, the normally-off processor 21, the oxide semiconductor RAM 22, and the peripheral unit 30 in the semiconductor device 103 are integrated in the same die 90, and the semiconductor device 103 may be regarded as a system on chip (SOC) structure, but not limited thereto. Additionally, the oxide semiconductor RAM 22 in this embodiment may include a cache memory preferably, and the cache memory composed of oxide semiconductors may be shared by the main processor 11 and the normally-off processor 21. In other words, the cache memory of the semiconductor device 103 in this embodiment is composed of oxide semiconductors, and the main processor 11 may not include a cache memory. Apart from the peripheral unit 30, other circuits such as a digital signal processor (DSP) or an amplifier may also be integrated in the die 90 according to design requirements. High speed interconnections in the die 90 may also be used to accelerate the data transferring speed between the main processor 11 and other units composed of oxide semiconductors such as the normally-off processor 21, the oxide semiconductor RAM 22, or even the peripheral unit 30. The semiconductor device 103 in this embodiment is more suitable for being applied in the relative low-end electronic products such as devices of internet of things (IoT) and electronic bracelets, and the required clock rate of the normally-off processor 21 and/or the oxide semiconductor RAM 22 may be relatively low (about lower than or equal to 100 MHz) in these products, but not limited thereto.

Figure 4:
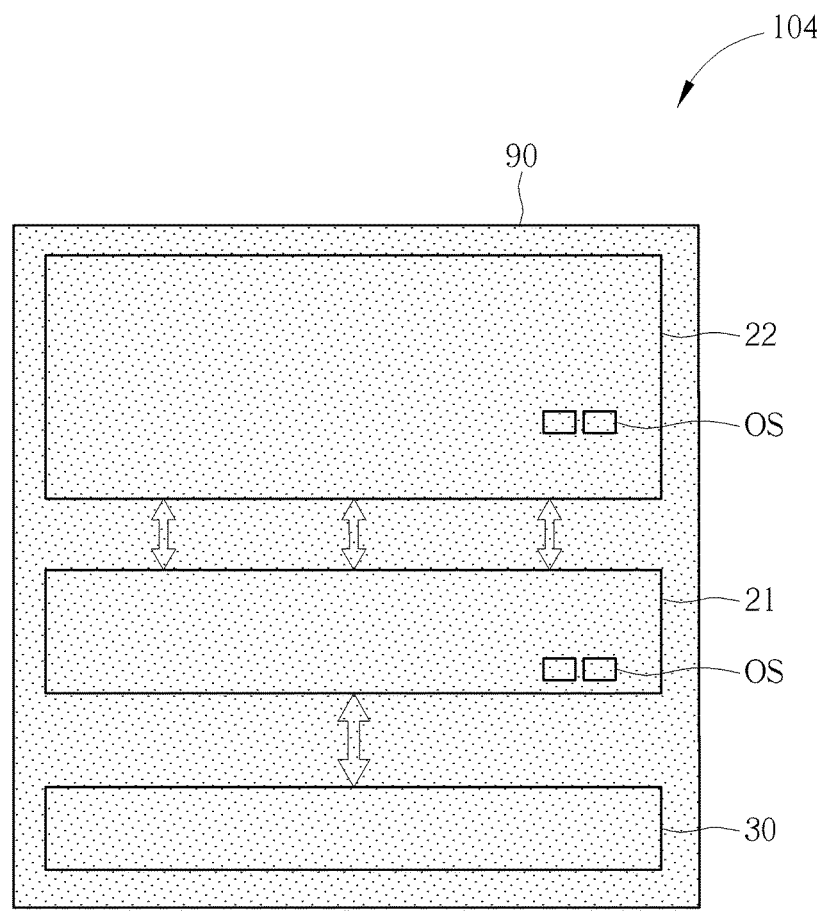
FIG. 4 is a schematic drawing illustrating a semiconductor device according to a fourth embodiment of the present invention.

Please refer to FIG. 4. FIG. 4 is a schematic drawing illustrating a semiconductor device 104 according to a fourth embodiment of the present invention. As shown in FIG. 4, the differences between the semiconductor device 104 of this embodiment and the semiconductor device of the third embodiment mentioned above is that the main processor is not included in the semiconductor device 104, and the semiconductor device 104 is operated by the normally-off processor 21. The normally-off processor 21 in this embodiment may be regarded as a kind of a micro control unit (MCU), but not limited thereto. In addition, when the semiconductor device 104 is turned on but there is no need to update data, the normally-off processor 21 may be settled in a power off condition, and the oxide semiconductor RAM 22 which is non-volatile and/or other auxiliary designs may be used to wake up the normally-off processor 21. The semiconductor device 104 in this embodiment is more suitable for being applied in the relative low-end electronic products with lower operation loading, such as sensors, devices of IoT and electronic bracelets, and the required clock rate of the normally-off processor 21 and/or the oxide semiconductor RAM 22 may be further lower (about lower than or equal to 50 MHz) in these products, but not limited thereto.

To summarize the above descriptions, in the semiconductor device of the present invention, the normally-off processor with the relatively lower clock rate and the random access memory are composed of the oxide semiconductors with low leakage current. The main processor with the relatively higher clock rate is applied to provide required efficacy performance for the applied product, and the normally-off processor and the oxide semiconductor RAM may be used to reduce power consumption. The semiconductor device of the present invention may provide more balanced performances on both the efficacy and the power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a main processor;
    a normally-off processor comprising at least one oxide semiconductor transistor, wherein the main processor is connected to the normally-off processor, and a clock rate of the main processor is higher than a clock rate of the normally-off processor; and
    at least one oxide semiconductor random access memory (RAM) connected to the normally-off processor, wherein the normally-off processor and the oxide semiconductor RAM are integrated in one die, and the oxide semiconductor RAM comprises a dynamic random access memory (DRAM) shared by the main processor and the normally-off processor, wherein the main processor and the normally-off processor are disposed on different dies.

2. The semiconductor device of claim 1, wherein the oxide semiconductor transistor comprises an indium gallium zinc oxide (IGZO) transistor, and the oxide semiconductor RAM comprises an IGZO RAM.

3. The semiconductor device of claim 1, further comprising:
    a peripheral unit connected to the main processor and the normally-off processor, wherein the peripheral unit comprises a global positioning system (GPS) unit, a wireless networking unit, or a sensor unit.

4. The semiconductor device of claim 1, wherein the main processor is a silicon semiconductor processor.

5. An operating method of a semiconductor device, comprising:
    providing the semiconductor device of claim 1; and
    backing up data from the main processor to the normally-off processor and/or the oxide semiconductor RAM.

6. The operating method of claim 5, wherein the semiconductor device further comprises a peripheral unit connected to the main processor and the normally-off processor, and the operating method of the semiconductor device further comprises:
    collecting data from the peripheral unit to the normally-off processor and/or updating a running program by the normally-off processor when the main processor enters a sleep mode.

7. The operating method of claim 6, wherein the normally-off processor and the oxide semiconductor RAM are integrated in one die, the semiconductor device further comprises a high speed RAM connected to the main processor and the die of the normally-off processor and the oxide semiconductor RAM, and the operating method of the semiconductor device further comprises:
    backing up data from the main processor to the normally-off processor and/or the oxide semiconductor RAM before and after the sleep mode.

* * * * *